United States Patent
Jung

(10) Patent No.: US 9,246,496 B2
(45) Date of Patent: Jan. 26, 2016

(54) SEMICONDUCTOR DEVICE, SEMICONDUCTOR SYSTEM AND METHOD FOR OPERATING SEMICONDUCTOR DEVICE

(71) Applicant: SK hynix Inc., Gyeonggi-do (KR)

(72) Inventor: Ji-Wan Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/489,157

(22) Filed: Sep. 17, 2014

(65) Prior Publication Data
US 2015/0333759 A1 Nov. 19, 2015

(30) Foreign Application Priority Data
May 19, 2014 (KR) .................. 10-2014-0059618

(51) Int. Cl.
| H03L 7/081 | (2006.01) |
| H03L 7/08 | (2006.01) |
| H03L 7/083 | (2006.01) |
| H03L 7/10 | (2006.01) |
| H03K 3/86 | (2006.01) |
| G06F 1/08 | (2006.01) |
| G06F 1/32 | (2006.01) |

(52) U.S. Cl.
CPC ............ *H03L 7/0802* (2013.01); *G06F 1/08* (2013.01); *G06F 1/324* (2013.01); *G06F 1/3296* (2013.01); *H03K 3/86* (2013.01); *H03L 7/083* (2013.01); *H03L 7/0814* (2013.01); *H03L 7/0816* (2013.01); *H03L 7/10* (2013.01)

(58) Field of Classification Search
CPC ............... H03L 7/081–7/0818; G06F 1/08; G06F 1/10; G06F 1/3206; G06F 1/324; G06F 1/3296
See application file for complete search history.

(56) References Cited

U.S. PATENT DOCUMENTS

| 6,605,969 | B2 * | 8/2003 | Mikhalev | G11C 7/1051 327/141 |
| 7,948,289 | B2 * | 5/2011 | Choi | H03L 7/0814 327/149 |
| 8,258,861 | B2 * | 9/2012 | Bhaumik | G06F 1/3203 327/544 |
| 8,519,760 | B2 * | 8/2013 | Kim | H03L 7/0814 327/149 |
| 2011/0050303 | A1 * | 3/2011 | Ma | G11C 7/222 327/158 |
| 2013/0094312 | A1 * | 4/2013 | Jang | G11C 7/04 365/194 |

FOREIGN PATENT DOCUMENTS

| KR | 1020070071141 | 7/2007 |
| KR | 1020130042373 | 4/2013 |

* cited by examiner

*Primary Examiner* — Patrick O'Neill
(74) *Attorney, Agent, or Firm* — IP & T Group LLP

(57) ABSTRACT

A semiconductor device includes a code generation block configured to generate an output clock by delaying a reference clock which is inputted from an exterior, control a delay value of the output clock based on a result of comparing phases of the reference clock and a feedback clock, and generate a first control code corresponding to the delay value of the output clock, a voltage generation block configured to generate an internal voltage with a voltage level corresponding to the first control code, a clock generation block configured to generate an internal clock with a frequency corresponding to the first control code, and a feedback delay block configured to generate the feedback clock by delaying the output clock by a delay value corresponding to a second control code.

25 Claims, 8 Drawing Sheets

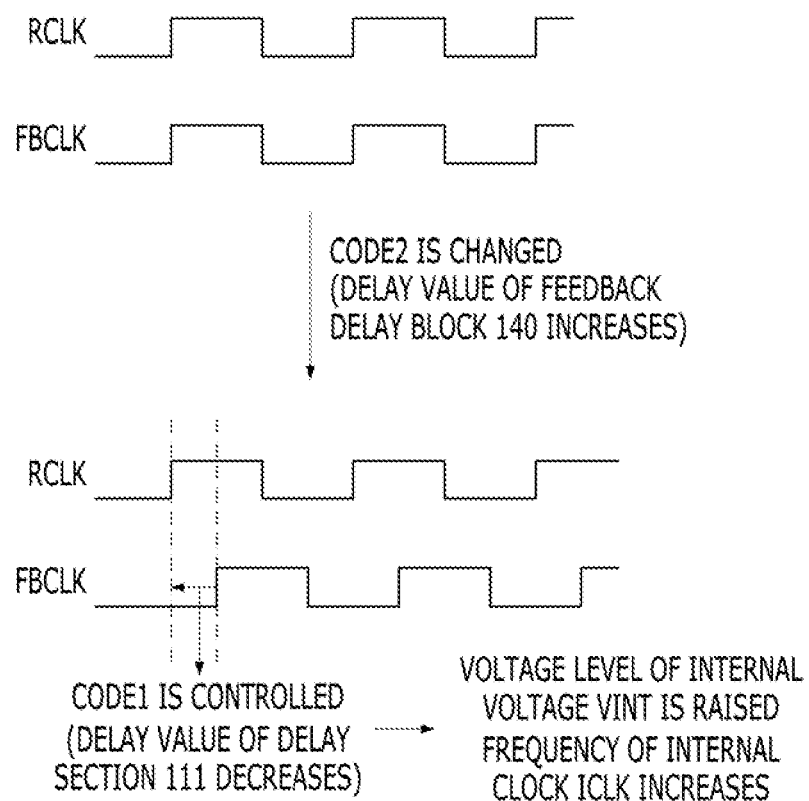

SEMICONDUCTOR DEVICE, SEMICONDUCTOR SYSTEM AND METHOD FOR OPERATING SEMICONDUCTOR DEVICE

CROSS-REFERENCE TO RELATED APPLICATIONS

The present application claims priority of Korean Patent Application No. 10-2014-0059618, filed on May 19, 2014, which is incorporated herein by reference in its entirety.

BACKGROUND

1. Field

This patent document relates to a semiconductor device, a semiconductor system, and a method for operating the semiconductor device.

2. Description of the Related Art

A system-on-chip (SoC) is a technology that incorporates various function blocks such as a CPU (central processing unit), a memory, an interface, a digital signal processing circuit and an analog signal processing circuit in one semiconductor integrated circuit. Application examples of SoCs include computer systems, electronic systems, and integrated circuits (IC) fabricated for various electronic devices.

The SoC is being developed with more complicated systems by absorbing various functions associated with processors, multimedia, graphics, interfaces and security. If the SoC technology is developed, the space occupied by chips on a circuit board may be reduced. Therefore the size of a product may be scaled down remarkably and noise generated by collisions in networking among chips that otherwise would be separately mounted may be eliminated. Also, power consumption for signal transmission between separated chips may be avoided and the fabrication cost may be reduced.

Such SoCs are being used in information communication devices and various other electronic devices and, recently, they have been applied to portable devices such as smart phones and tablet PCs. In portable devices that use batteries, power consumption is battery leading factor in determining battery life. Therefore it is important to minimize power consumption while still delivering a chip with the performance that is demanded. Since performance (processing speed) and power consumption have a trade-off relationship in semiconductor circuits, it is important to appropriately retain the balance between performance and power consumption, based on the particular application.

One of technologies that is being researched to satisfy both requirements of performance optimization and minimization of power consumption for an SoC is DVFS (dynamic voltage frequency scaling) technology. The DVFS technology controls the frequency and voltage of a semiconductor circuit. As the clock signal frequency in a semiconductor circuit increases in conjunction with a high voltage power supply, the operation speed of the semiconductor circuit increases and power consumption increases as well. Conversely, as the clock signal frequency decreases and the voltage level and the power supply voltage is lowered, the operation speed of the semiconductor circuit decreases and power consumption decreases as well.

SUMMARY

Various embodiments are directed to a semiconductor device that may determine its operation speed and stably retain factors (such as operation voltage and operation frequency) that determine the operation speed regardless of changes in the operation circumstances thereof, and a semiconductor system and an operation method for the semiconductor device.

Also, various embodiments are directed to a semiconductor device that may secure a high operation speed and minimize power consumption by optimizing the operation speed thereof, and a semiconductor system and an operation method for the semiconductor device.

In an embodiment, a semiconductor device may include a code generation block suitable for generating an output clock by delaying a reference clock which is inputted from an exterior, controlling a delay value of the output clock based on a result of comparing phases of the reference clock and a feedback clock, and generating a first control code corresponding to the delay value of the output clock, a voltage generation block suitable for generating an internal voltage with a voltage level corresponding to the first control code, a clock generation block suitable for generating an internal clock with a frequency corresponding to the first control code, and a feedback delay block suitable for generating the feedback clock by delaying the output clock by a delay value corresponding to a second control code.

In an embodiment, a semiconductor system may include a controller suitable for generating an external voltage, an external clock, and first to $N^{th}$ external control codes, wherein the N is a natural number greater than 1, and first to $N^{th}$ semiconductor devices each suitable for generating an output clock by delaying the external clock, controlling a delay value of the output clock based on a result of comparing phases of the external clock and a feedback clock, and generating an internal voltage with a voltage level corresponding to the delay value of the output clock and an internal clock with a frequency corresponding to the delay value of the output clock, wherein the feedback clock is generated by delaying the output clock by a delay value determined by a corresponding external control code among the first to $N^{th}$ external control codes.

In an embodiment, a method for operating a semiconductor device may include applying an external control code, delaying an output clock, which is generated by delaying a reference clock, by a delay value corresponding to the external control code, and generating a feedback clock, controlling a delay value of the output clock by comparing phases of the reference clock and the feedback clock, and generating an internal control code corresponding to the delay value of the output clock, and generating an internal voltage with a voltage level corresponding to the internal control code and an internal clock with a frequency corresponding to the internal control code.

In an embodiment, a semiconductor system may include a controller suitable for generating an external clock and a plurality of external control controls, a plurality of semiconductor devices each suitable for generating an internal control code, and controlling the internal control code by comparing the external clock and a feedback clock, generating an output clock by delaying the external clock by a first delay value determined by the internal control code, and generating the feedback clock by delaying the output clock by a second delay value determined by a corresponding one of the plurality of external control codes, wherein the plurality of semiconductor devices each generates an internal voltage with a voltage level corresponding to the internal control code and an internal clock with a frequency corresponding to the internal control code.

According to the embodiments, if an operation speed of a semiconductor device is determined, factors (such as an operation voltage and an operation frequency) that exert influences on the operation speed may be stably retained through a feedback structure.

Also according to the embodiments, since an operation speed of a semiconductor device is determined based on a work load, the operation speed of the semiconductor device may be optimized in such a way to secure high operation speed and minimize power consumption.

BRIEF DESCRIPTION OF THE DRAWINGS

FIGS. 3A to 3D are diagrams explaining operations of the semiconductor device shown in FIG. 1.

DETAILED DESCRIPTION

Figure 1:
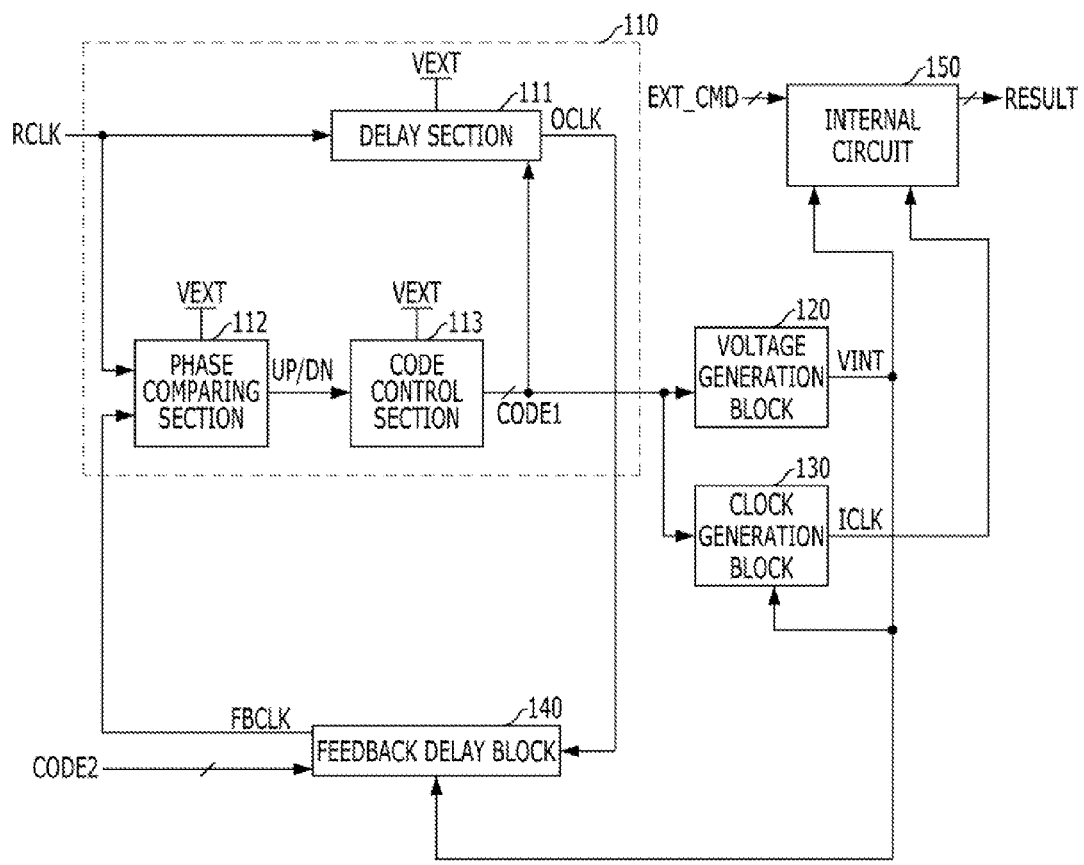
FIG. 1 is a configuration diagram of a semiconductor device in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the drawings, a thickness and length of components are exaggerated for convenience of illustration. In the following description, a detailed explanation of known related functions and constitutions may be omitted to avoid unnecessarily obscuring the subject manner of the present invention. Furthermore, 'connected/coupled' represents that one component is directly coupled to another component or indirectly coupled through another component. In this specification, a singular form may include a plural form, and vice versa, as long as it is not specifically mentioned in a sentence. Furthermore, 'include/comprise' or 'including/comprising' used in the specification represents that one or more components, steps operations, and elements exist or are added.

FIG. 1 is a configuration diagram of a semiconductor device in accordance with an embodiment.

As shown in FIG. 1, a semiconductor device may include a code generation block 110, a voltage generation block 120, a clock generation block 130, a feedback delay block 140, and an internal circuit 150. The target operation speed of the semiconductor device may be controlled by a second control code CODE2 which is inputted from an exterior.

The semiconductor device will be described below with reference to FIG. 1.

The code generation block 110 delays a reference clock RCLK which is inputted from the exterior, and generates an output clock OCLK. The delay value of the output clock OCLK is controlled based on a result of comparing the phases of the reference clock RCLK and a feedback clock FBCLK. Also, the code generation block 110 generates a first control code CODE1 corresponding to the delay value of the output clock OCLK. The code generation block 110 operates using an external voltage VEXT which is inputted from the exterior of the semiconductor device. The external voltage VEXT represents a voltage which is not influenced by a change in the internal operation circumstances of the semiconductor device. The internal operation circumstances of the semiconductor device may mean, for example, PVT (process, voltage and temperature) conditions in the semiconductor device. Therefore, the operation of the code generation block 110 is not influenced by a change in the operation circumstances in the semiconductor device.

The first control code CODE1 may include multi-bit signals. The first control code CODE1 may have a binary value corresponding to the delay value of the output clock OCLK. For example, if the delay value of the output clock OCLK increases, the binary value represented by the first control code CODE1 may also increase, and, if the delay value of the output clock OCLK decreases, the binary value represented by the first control code CODE1 may also decrease. In contrast, the delay value of the output clock OCLK and the binary value represented by the first control code CODE1 may be inversely proportional to each other.

For such an operation, the code generation block 110 may include a delay section 111, a phase comparing section 112, and a code control section 113. The delay section 111 delays the reference clock RCLK and generates the output clock OCLK. The delay value of the delay section 111 is determined in response to the first control code CODE1. For example, if the value of the first control code CODE1 increases, the delay value of the delay section 111 may also increase, and, if the value of the first control code CODE1 decreases, the delay value of the delay section 111 may also decrease. In contrast, the value of the first control code CODE1 and the delay value of the delay section 111 may be inversely proportional to each other.

The phase comparing section 112 compares the phases of the reference clock RCLK and the feedback clock FBCLK, and outputs a comparison result UP/DN. The code control section 113 controls the value of the first control code CODE1 in response to the comparison result UP/DN of the phase comparing section 112.

In the case where the phase of the feedback clock FBCLK is earlier than the phase of the reference clock RCLK, the phase comparing section 112 outputs the comparison result UP/DN which causes the delay value of the delay section 111 to increase. The code control section 113 increases the value of the first control code CODE1 in response to such a comparison result UP/DN. Conversely, in the case where the phase of the feedback clock FBCLK is later than the phase of the reference clock RCLK, the phase comparing section 112 outputs the comparison result UP/DN which causes the delay value of the delay section 111 to decrease. The code control section 113 decreases the value of the first control code CODE1 in response to such a comparison result UP/DN.

The voltage generation block 120 receives the first control code CODE1, and generates an internal voltage VINT which has a voltage level corresponding to the first control code CODE1. The internal voltage VINT may have a voltage level corresponding to the value of the first control code CODE1. For example, the voltage generation block 120 may raise the voltage level of the internal voltage VINT when the value of the first control code CODE1 increases, and may lower the voltage level of the internal voltage VINT when the value of the first control code CODE1 decreases. On the contrary, the value of the first control code CODE1 and the voltage level of the internal voltage VINT may be inversely proportional to each other.

For reference, the voltage generation block 120 may increase the voltage level of the internal voltage VINT by a unit value each time the first control code CODE1 increases by a unit value or by X (X is a preset constant) times a unit value. The voltage generation block 120 may include a digital-to-analog converter (DAC) which generates an analog signal with a level corresponding to the value of a multi-bit binary signal.

The clock generation block 130 receives the first control code CODE1, and generates an internal clock ICLK which has a frequency corresponding to the first control code CODE1. The internal clock ICLK may have a frequency (or a cycle) corresponding to the value of the first control code CODE1. For example, the clock generation block 130 may increase the frequency of the internal clock ICLK if the value of the first control code CODE1 increases, and may decrease the frequency of the internal clock ICLK if the value of the first control code CODE1 decreases. In contrast, the value of the first control code CODE1 and the frequency of the internal clock ICLK may be inversely proportional to each other.

For reference, the clock generation block 130 may increase the frequency of the internal clock ICLK by a unit value each time the first control code CODE1 increases by a unit value or by Y (Y is a preset constant) times a unit value.

The clock generation block 130 may generate the internal clock ICLK by dividing the reference clock RCLK, and may control a division ratio for dividing the reference clock RCLK, in response to the first control code CODE1. For example, the clock generation block 130 may increase a division ratio if the value of the first control code CODE1 increases, and may decrease a division ratio if the value of the first control code CODE1 decreases. In contrast, the value of the first control code CODE1 and a division ratio may be inversely proportional to each other. For reference, the clock generation block 130 may include a clock division circuit which divides the reference clock RCLK with a division ratio determined based on the value of the first control code CODE1.

The feedback delay block 140 delays the output clock OCLK by a delay value corresponding to the second control code CODE2, and generates the feedback clock FBCLK. The second control code CODE2 may be a code which is inputted from the exterior of the semiconductor device, and may be a code corresponding to the target operation speed of the semiconductor device. That is to say, the second control code CODE2 may be a code for setting the operation speed of the semiconductor device. The feedback delay block 140 may increase the delay value if the value of the second control code CODE2 increases, and may decrease the delay value if the value of the second control code CODE2 decreases. In contrast, the value of the second control code CODE2 and the delay value of the feedback delay block 140 may be inversely proportional to each other.

For reference, the clock generation block 130 and the feedback delay block 140 may operate using the internal voltage VINT. Therefore, if the voltage level of the internal voltage VINT varies with a change in the operation circumstances in the semiconductor device, the frequency of the internal clock ICLK outputted from the clock generation block 130 and the delay value of the feedback delay block 140 may vary. For example, if the voltage level of the internal voltage VINT rises, the frequency of the internal clock ICLK increases, and the delay value of the feedback delay block 140 decreases. Conversely, if the voltage level of the internal voltage VINT falls, the frequency of the internal clock ICLK decreases, and the delay value of the feedback delay block 140 increases.

The internal circuit 150 operates using the internal voltage VINT and the internal clock ICLK. The internal circuit 150 may operate at a speed corresponding to the voltage level of the internal voltage VINT and the frequency of the internal clock ICLK. The operation speed of the internal circuit 150 increases as the voltage level of the internal voltage VINT rises and the frequency of the internal clock ICLK increases, and decreases as the voltage level of the internal voltage VINT falls and the frequency of the internal clock ICLK decreases.

For reference, the internal circuit 150 may be a circuit which has predetermined functions of performing an operation corresponding to a command EXT_CMD inputted from the exterior of the semiconductor device and outputting a result as an output RESULT. For example, the internal circuit 150 may be a memory circuit which stores data or outputs stored data in response to the command EXT_CMD. Moreover, the internal circuit 150 may be an arithmetic circuit to processor) which performs an arithmetic operation in response to the command EXT_CMD or a digital signal processing circuit or an analog signal processing circuit which processes an inputted signal. The internal circuit 150 may be one of various circuits or a combination of circuits, which operate using the internal voltage VINT and the internal clock ICLK.

Figure 2:
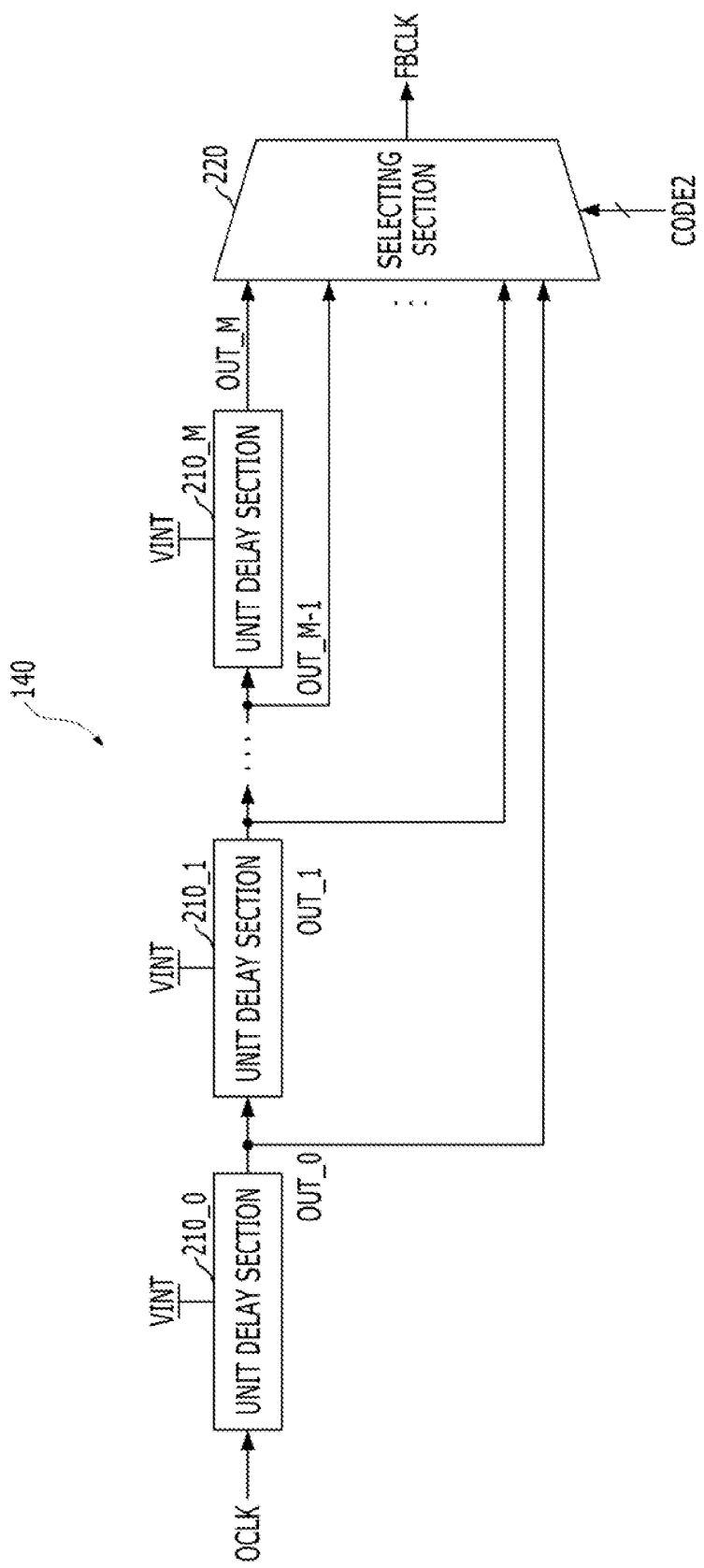
FIG. 2 is a configuration diagram of a feedback delay block shown in FIG. 1.

FIG. 2 is a configuration diagram of the feedback delay block 140 shown in FIG. 1.

As shown in FIG. 2, the feedback delay block 140 may include a plurality of unit delay sections 210_0 to 210_M and a selecting section 220.

The feedback delay block 140 will be described below with reference to FIG. 2.

The plurality of unit delay sections 210_0 to 210_M delay input signals by a predetermined delay value and output output signals OUT_0 to OUT_M. Each of the plurality of unit delay sections 210_0 to 210_M may have a delay value corresponding to the voltage level of the internal voltage VINT. Accordingly, if the voltage level of the internal voltage VINT rises, the delay value of the unit delay sections 210_0 to 210_M may decrease, and, if the voltage level of the internal voltage VINT falls the delay value of the unit delay sections 210_0 to 210_M may increase.

The plurality of unit delay sections 210_0 to 210_M may be connected in series, and the first unit delay section 210_0 which is connected first among the plurality of unit delay sections 210_0 to 210_M may receive the output clock OCLK. Thus, the output signals OUT_0 to OUT_M of the plurality of unit delay sections 210_0 to 210_M may be clocks which are generated by delaying the output clock OCLK by one to M−1 times the delay value (hereinafter, referred to as a 'unit delay value') of each unit delay section. For example, an output OUT_K may be a clock which is generated by delaying the output clock OCLK by K−1 times the unit delay value.

The selecting section 220 transfers an output signal selected in response to the second control code CODE2 among the output signals OUT_0 to OUT_M of the plurality of unit delay sections 210_0 to 210_M, as the feedback clock FBCLK. For example, the selecting section 220 may transfer the output of a later-staged unit delay section as the feedback clock FBCLK as the value of the second control code CODE2 increases, and may transfer the output of an earlier-staged unit delay section as the feedback clock FBCLK as the value of the second control code CODE2 decreases. Accordingly, the delay value of the feedback delay block 140 may be increased by increasing the value of the second control code CODE2, and the delay value of the feedback delay block 140 may be decreased by decreasing the value of the second control code CODE2.

There may be 2 cases in which the delay value of the feedback delay block 140 is changed. The first case where the delay value is controlled by changing the value of the second control code CODE2 as described above. The second case where the unit delay value is changed with a change in the voltage level of the internal voltage VINT. In the latter case, the delay value decreases if the voltage level of the internal voltage VINT rises, and the delay value increases if the voltage level of the internal voltage VINT falls.

FIGS. 3A to 3D are diagrams explaining operations of the semiconductor device shown in FIG. 1.

In FIGS. 3A to 3D, descriptions will be made for operations of the semiconductor device which is designed in such a manner that the delay value of the delay section 111 and the value of the first control code CODE1 are proportional to each other, and the delay value of the feedback delay block 140 and the value of the second control code CODE2 are proportional to each other, and the value of the first control code CODE1 and the voltage level of the internal voltage VINT and the frequency of the internal clock ICLK are inversely proportional to each other.

Figure 3B:
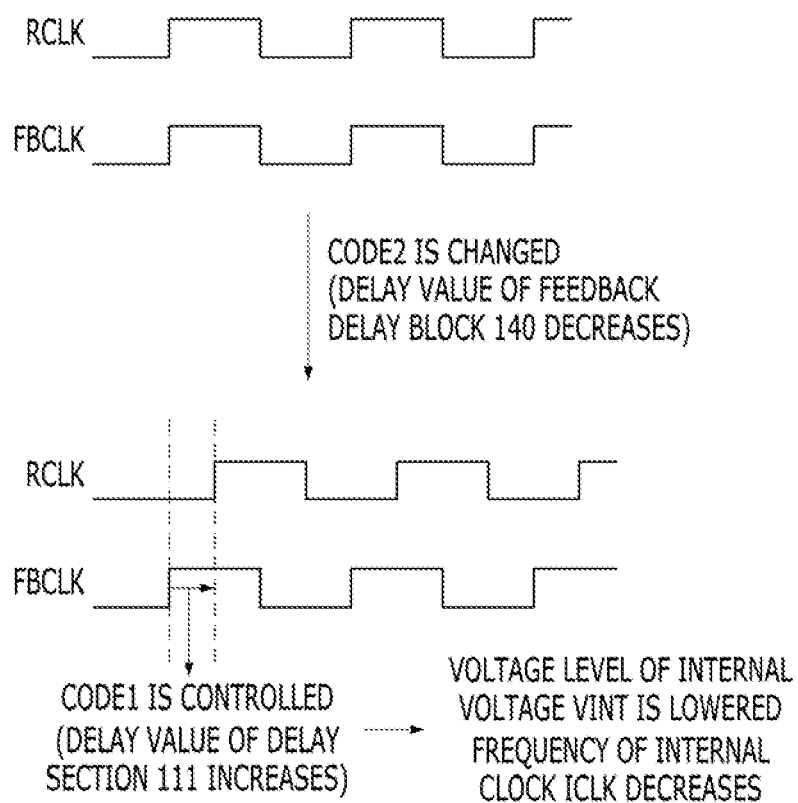

FIGS. 3A and 3B are diagrams explaining processes in which the operation speed of the semiconductor device is changed by controlling the value of the second control code CODE2.

FIG. 3A represents a process in which the operation speed of the semiconductor device is increased by controlling the second control code CODE2.

If the value of the second control code CODE2 is increased for a high speed operation mode, the delay value of the feedback delay block 140 increases in response to the second control code CODE2. If the delay value of the feedback delay block 140 increases, the phase of the feedback clock FBCLK is delayed to be later than that of the reference clock RCLK. Hence, based on the comparison result. UP/DN of the phase comparing section 112, the value of the first control code CODE1 decreases, and the delay value of the delay section 111 decreases. The first control code CODE1 decreases until the phase of the reference clock RCLK and the phase of the feedback clock FBCLK are the same.

If the value of the first control code CODE1 decreases, the voltage generation block 120 raises the voltage level of the internal voltage VINT, and the clock generation block 130 increases the frequency of the internal clock ICLK. Accordingly, the operation speed of the semiconductor device increases.

FIG. 3B represents a process in which the operation speed of the semiconductor device is decreased by controlling the second control code CODE2.

If the value of the second control code CODE2 is decreased for a low speed operation mode, the delay value of the feedback delay block 140 decreases in response to the second control code CODE2. If the delay value of the feedback delay block 140 decreases, the phase of the feedback clock FBCLK is advanced to be earlier than that of the reference clock RCLK. Hence, based on the comparison result UP/DN of the phase comparing section 112, the value of the first control code CODE1 increases, and the delay value of the delay section 111 increases. The first control code CODE1 increases until the phase of the reference dock RCLK and the phase of the feedback dock FBCLK are the same.

If the value of the first control code CODE1 increases, the voltage generation block 120 lowers the voltage level of the internal voltage VINT, and the clock generation block 130 decreases the frequency of the internal clock ICLK. Accordingly, the operation speed of the semiconductor device decreases.

Figure 3C:
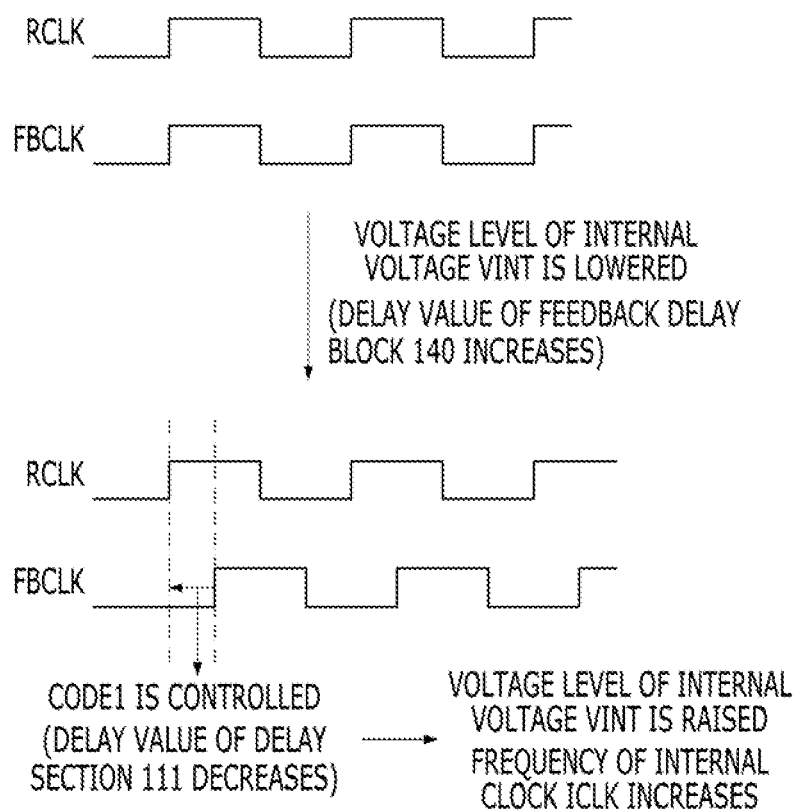
Figure 3D:
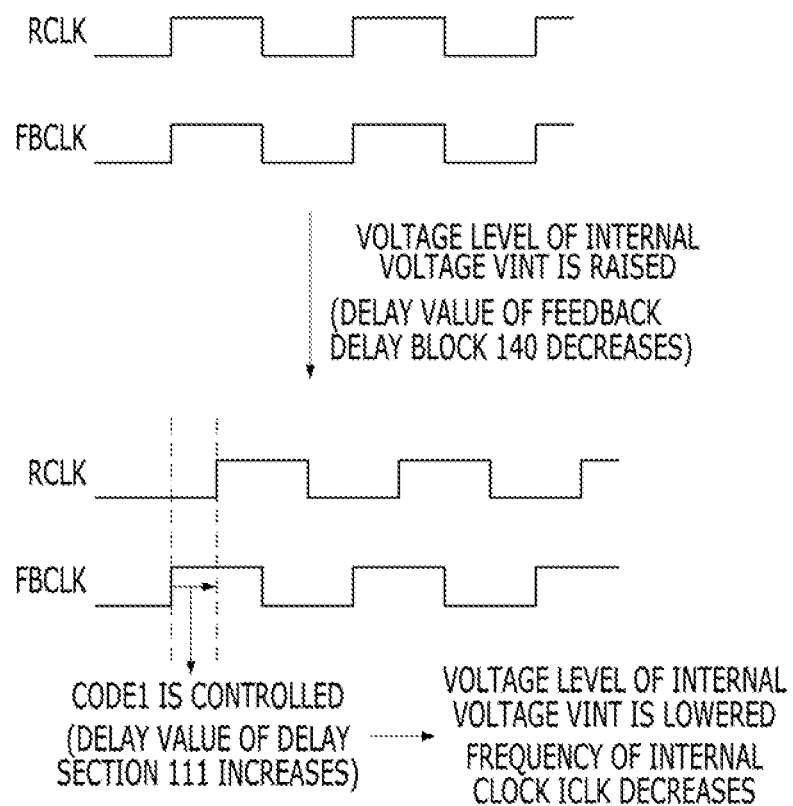

FIGS. 3C and 3D are diagrams explaining processes in which the operation speed of the semiconductor device is constantly retained regardless of a change in the internal circumstances of the semiconductor device when the value of the second control code CODE2 is fixed. If the value of the second control code CODE2 is determined, the target operation speed of the semiconductor device is determined, and the semiconductor device is to retain the operation speed corresponding to the second control code CODE2. If the speed of the semiconductor device varies due to a change in the operation circumstances in the semiconductor device, unnecessary power consumption may occur (when the operation speed increases) or performance may be degraded (when the operation speed decreases).

FIG. 3C represents a process in which the operation speed of the semiconductor device remains constant when the voltage level of the internal voltage VINT of the semiconductor decreases.

If the voltage level of the internal voltage VINT falls, the delay value of the feedback delay block 140 increases. If the delay value of the feedback delay block 140 increases, the phase of the feedback dock FBCLK is delayed to be later than the phase of the reference dock RCLK. Hence, based on the comparison result UP/DN of the phase comparing section 112, the value of the first control code CODE1 decreases, and the delay value of the delay section 111 decreases. The first control code CODE1 decreases until the phase of the reference clock RCLK and the phase of the feedback clock FBCLK are the same.

If the value of the first control code CODE1 decreases, the voltage generation block 120 raises the voltage level of the internal voltage VINT, and the clock generation block 130 increases the frequency of the internal clock ICLK. Accordingly, the semiconductor device recovers the target operation speed.

FIG. 3D represents a process in which the operation speed of the semiconductor device remains constant when the voltage level of the internal voltage VINT of the semiconductor device rises.

If the voltage level of the internal voltage VINT rises, the delay value of the feedback delay block 140 decreases. If the delay value of the feedback delay block 140 decreases, the phase of the feedback clock FBCLK is advanced to be earlier than the phase of the reference clock RCLK. Hence, based on the comparison result UP/DN of the phase comparing section 112, the value of the first control code CODE1 increases, and the delay value of the delay section 111 increases. The first control code CODE1 increases until the phase of the reference clock RCLK and the phase of the feedback clock FBCLK are the same.

If the value of the first control code CODE1 increases, the voltage generation block 120 lowers the voltage level of the internal voltage VINT, and the clock generation block 130 decreases the frequency of the internal clock ICLK. Accordingly, the semiconductor device recovers the target operation speed.

The semiconductor device according to the embodiment controls the operation speed thereof by using the control code CODE2 inputted from the exterior as the occasion demands. Consequently, the operation speed of the semiconductor device may be optimized, allowing high operation speed of the semiconductor device to be secured and power consumption to be minimized. Also, by causing a configuration (110) for generating the control code CODE1 for controlling the operation speed of the semiconductor device not to be influenced by the operation circumstances in the semiconductor device. Because the code generation block 110 uses the external voltage VEXT, and doesn't use the internal voltage VINT. Therefore, once the target operation speed of the semiconductor device is determined, the target operation speed of the semiconductor device may be stably retained regardless of a change in the operation circumstances in the semiconductor device.

Figure 4:
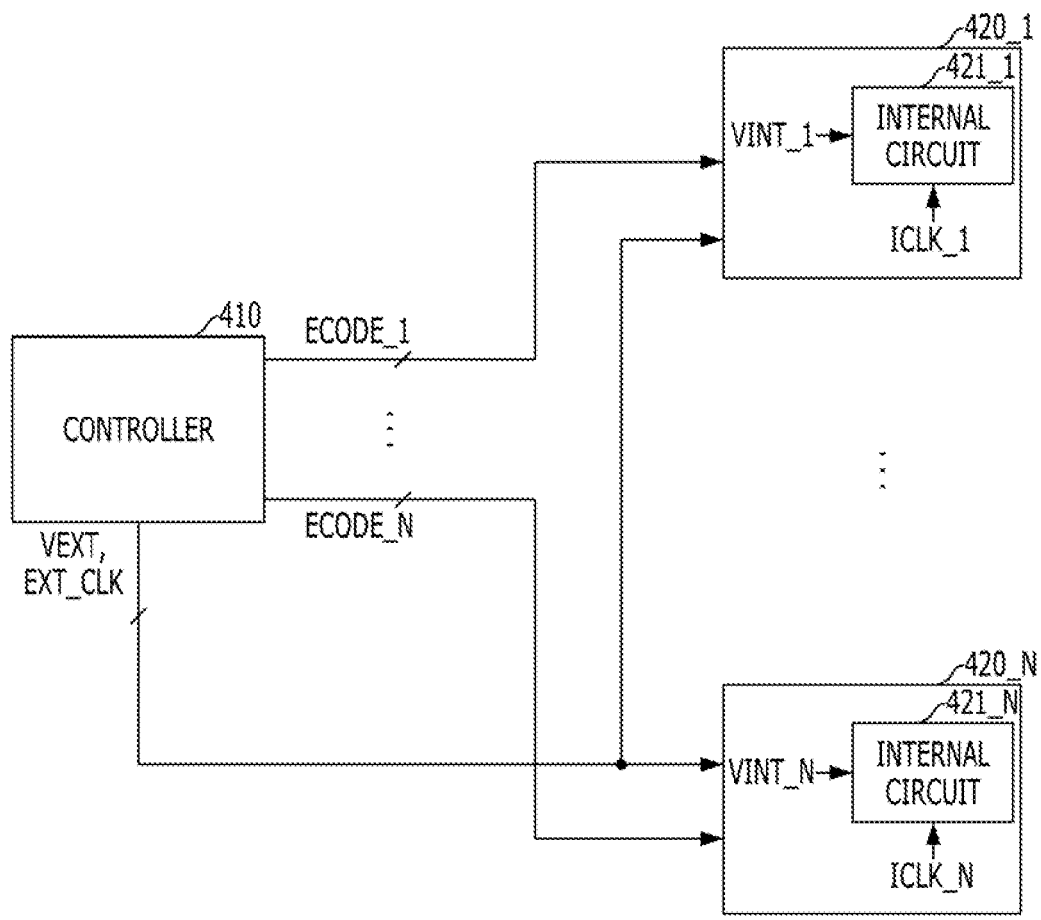
FIG. 4 is a configuration diagram of a semiconductor system in accordance with an embodiment.

FIG. 4 is a configuration diagram of a semiconductor system in accordance with an embodiment.

As shown in FIG. 4, a semiconductor system may include a controller 410, and first to $N^{th}$ semiconductor devices 420_1 to 420_N. The first to $N^{th}$ semiconductor devices 420_1 to 420_N may respectively include internal circuits 421_1 to 421_N.

The semiconductor system will be described below with reference to FIG. 4.

Each of the first to $N^{th}$ semiconductor devices 420_1 to 420_N may be the same as the semiconductor device of FIG. 1. The first to $N^{th}$ semiconductor devices 420_1 to 420_N may respectively correspond to first to $N^{th}$ external control codes ECODE_1 to ECODE_N. The target operation speeds of the first to $N^{th}$ semiconductor devices 420_1 to 420_N may be determined by the first to $N^{th}$ external control codes ECODE_1 to ECODE_N, respectively. Each of the first to $N^{th}$ external control codes ECODE_1 to ECODE_N may be a code corresponding to the second control code CODE2 of FIG. 1.

The first to $N^{th}$ semiconductor devices 420_1 to 420_N may control the voltage levels of internal voltages VINT_1 to VINT_N and the frequencies of internal clocks ICLK_1 to ICLK_N by internally generating internal control codes (not shown). Each of the internal control codes internally generated by the first to $N^{th}$ semiconductor devices 420_1 to 420_N may be a code corresponding to the first control code CODE1 of FIG. 1.

The internal circuits 421_1 to 421_N of the respective first to $N^{th}$ semiconductor devices 420_1 to 420_N operate using the internal voltages VINT_1 to VINT_N and the internal clocks ICLK_1 to ICLK_N corresponding to them. The internal circuits 421_1 to 421_N of the first to $N^{th}$ semiconductor devices 420_1 to 420_N may operate at the speeds determined by the voltage levels of the corresponding internal voltages VINT_1 to VINT_N and the frequencies of the corresponding internal clocks ICLK_1 to ICLK_N.

The controller 410 may generate an external voltage VEXT, an external clock EXT_CLK and the first to $N^{th}$ external control codes ECODE_1 to ECODE_N to be transmitted to the first to $N^{th}$ semiconductor devices 420_1 to 420_N. The external voltage VEXT generated by the controller 410 may correspond to the external voltage VEXT of FIG. 1, and the external clock EXT_CLK generated by the controller 410 may correspond to the reference clock RCLK of FIG. 1 or may be a source of the reference clock RCLK. The external clock EXT_CLK as a source of the reference clock RCLK means that the reference clock RCLK is the external clock EXT_CLK or a clock which is generated by dividing the external clock EXT_CLK with a predetermined division ratio.

The controller 410 may control the operation speeds of the first to $N^{th}$ semiconductor devices 420_1 to 420_N by using the first to $N^{th}$ external control codes ECODE_1 to ECODE_N. Referring to the descriptions of FIGS. 1 to 3, for example, the value of an external control code corresponding to a semiconductor device of which operation speed is to be increased is increased, and the value of an external control code corresponding to a semiconductor device of which operation speed is to be decreased is decreased.

The operation speed of a semiconductor device may be determined by the work load of the corresponding semiconductor device. The work load indicates an allocation amount of works to be performed in a unit system (a semiconductor chip, a semiconductor circuit, or the like) within a predetermined time. In the semiconductor system of FIG. 4, a work load may indicate an allocation amount of works for a semiconductor device among the first to $N^{th}$ semiconductor devices 420_1 to 420_N to perform within a predetermined time. By referring to the work loads of the first to $N^{th}$ semiconductor devices 420_1 to 420_N, the controller 410 may change the value of a corresponding external control code for high speed operation of a semiconductor device with a high work load, and may change the value of a corresponding external control code for reducing power consumption of a semiconductor device with a low work load.

For example, a work load may be determined by counting the number of commands applied to a semiconductor device within a predetermined time. A command represents a combination of at least one signal applied from a controller to enable the semiconductor device to perform a specified operation. A semiconductor device applied with a large number of commands within a predetermined time may have a high work load, and a semiconductor device applied with a small number of commands within the predetermined time may have a low work load. In the case where the semiconductor device is a semiconductor memory device, the commands may be, for example, an active command, a write command, a read command, a precharge command, a refresh command, and so forth, which are applied by a memory controller to the semiconductor memory device. In other words, a semiconductor memory device applied with a large number of commands within a predetermined time (that is larger than a predetermined number) may be recognized as having a high work load and may be applied with an external control code for a high speed operation, and a semiconductor memory device applied with a small number of commands within the predetermined time (that is smaller than the predetermined number) may be recognized as having a low work load and may be applied with an external control code for a low speed operation.

In the semiconductor system in accordance with the embodiment, an external control code for controlling the operation speed of a semiconductor device is determined based on a work load thereof. As a consequence the operation speeds of semiconductor devices may be optimized in conformity with respective work loads thereof, whereby it is possible to achieve optimum performance and minimize power consumption. Moreover, if the target operation speeds of the semiconductor devices are determined, these operation speeds may not be influenced by operation circumstances in the semiconductor devices, whereby it is possible to stably retain the operation speeds of the semiconductor devices regardless of changes in the operation circumstances in the semiconductor devices.

Figure 5:
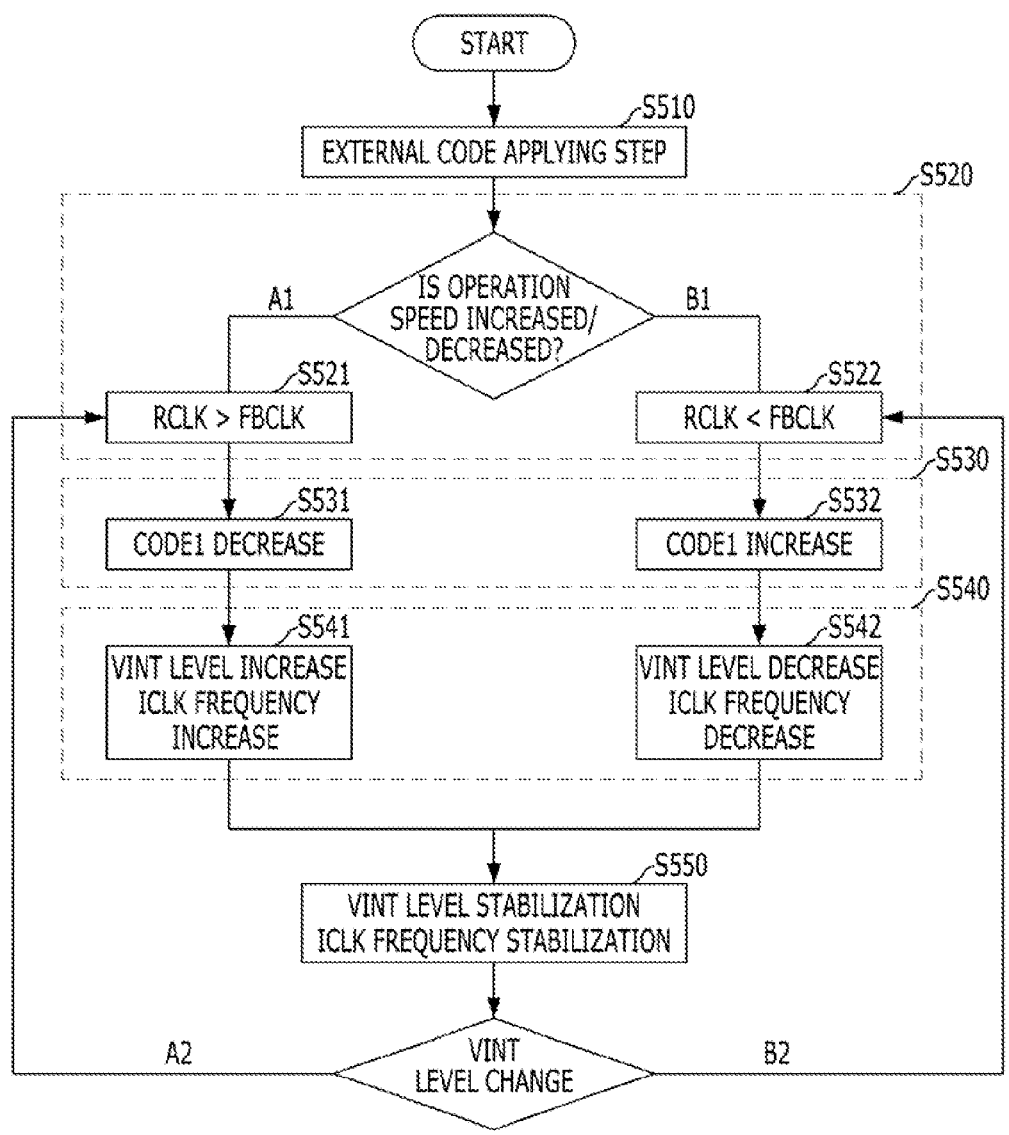
FIG. 5 is a flow chart explaining a method for operating a semiconductor device in accordance with an embodiment.

FIG. 5 is a flow chart explaining a method for operating a semiconductor device in accordance with an embodiment.

The method for operating a semiconductor device will be described below with reference to FIGS. 1 to 5.

In order to change the target operation speed of the semiconductor device, the external control code CODE2 is first applied from the exterior of the semiconductor device (an external code applying step S510). The external control code CODE2 may have a value that is determined in consideration of a work load of the semiconductor device.

The semiconductor device delays the output clock OCLK by a delay value corresponding to the external control code CODE2, and generates the feedback clock FBCLK (a feedback clock generating step S520). The output clock OCLK is a clock which is generated by delaying the reference clock RCLK inputted from the exterior of the semiconductor device. The feedback clock generating step S520 is performed using the internal voltage VINT.

If the external control code CODE2 is applied in the external code applying step S510 to increase the operation speed of the semiconductor device, the delay value of the feedback delay block 140 is increased (A1) and the phase of the feedback clock FBCLK becomes later than the phase of the reference clock RCLK (S521). Conversely, if the external control code CODE2 is applied to decrease the operation speed of the semiconductor device, the delay value of the feedback delay block 140 is decreased (B1), and the phase of the feedback clock FBCLK becomes earlier than the phase of the reference clock RCLK (S522).

Next, the delay value of the output clock OCLK is controlled by comparing the phases of the reference clock RCLK and the feedback clock FBCLK, and the internal control code CODE1 corresponding to the delay value of the output clock OCLK is generated (an internal code generating step S530). When the phase of the feedback clock FBCLK is later than the phase of the reference clock RCLK, the delay value of the delay section 111 and the value of the internal control code CODE1 decrease (S531), and, when the phase of the feedback clock FBCLK is earlier than the phase of the reference clock RCLK, the delay value of the delay section 111 and the value of the internal control code CODE1 increase (S532). The internal code generating step S530 is performed using the external voltage VEXT.

Finally the internal voltage VINT, which has a voltage level corresponding to the internal control code CODE1, and the internal clock ICLK, which has a frequency corresponding to the internal control code CODE1, are generated (a voltage/clock generating step S540). If the value of the internal control code CODE1 decreases, the voltage level of the internal voltage VINT and the frequency of the internal clock ICLK are increased (S541), and, if the value of the internal control code CODE1 increases, the voltage level of the internal voltage VINT and the frequency of the internal dock ICLK are decreased (S542). If the phases of the reference dock RCLK and the feedback clock FBCLK become the same, the value of the internal control code CODE1 is fixed, and the voltage level of the internal voltage VINT and the frequency of the internal clock ICLK are stabilized (S550).

If the voltage level of the internal voltage VINT fails in the state in which the voltage level of the internal voltage VINT and the frequency of the internal clock ICLK are stabilized (S550) after the external control code CODE2 is fixed, the delay value of the feedback clock FBCLK increases (A2), and thus, the phase of the feedback clock FBCLK becomes later than the phase of the reference clock RCLK (S521). Therefore the voltage level of the internal voltage VINT and the frequency of the internal clock ICLK are stabilized again through the steps S531 and S541 (S550). Also, if the voltage level of the Internal voltage VINT rises, the delay value of the feedback clock FBCLK decreases (B2), and thus, the phase of the feedback clock FBCLK becomes earlier than the phase of the reference clock RCLK (S522). Therefore, the voltage level of the internal voltage VINT and the frequency of the internal clock ICLK are stabilized again through the steps S532 and S542 (S550).

In the method for operating a semiconductor device in accordance with the embodiment, the operation speed of a semiconductor device may be controlled depending on work load to achieve optimal performance and minimize power consumption. Also, if target operation speed of the semiconductor device is determined, the operation speed of the semiconductor device may be stably retained.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   a code generation block suitable for generating an output clock by delaying a reference clock which is inputted from an exterior, controlling a delay value of the output clock based on a result of comparing phases of the reference clock and a feedback clock, and generating a first control code corresponding to the delay value of the output clock;
   a voltage generation block suitable for generating an internal voltage with a voltage level corresponding to the first control code;
   a clock generation block suitable for generating an internal clock with a frequency corresponding to the first control code; and
   a feedback delay block suitable for generating the feedback clock by delaying the output clock by a delay value corresponding to a second control code.

2. The semiconductor device according to claim 1, wherein the code generation block operates using an external voltage which is inputted from the exterior, and the clock generation block and the feedback delay block operate using the internal voltage.

3. The semiconductor device according to claim 1, wherein the code generation block comprises:
   a delay section suitable for delaying the reference dock by a delay value corresponding to the first control code, and generating the output clock;
   a phase comparing section suitable for comparing the phases of the reference clock and the feedback clock; and
   a code control section suitable for controlling the first control code based on a comparison result of the phase comparing section.

4. The semiconductor device according to claim 1, wherein the clock generation block generates the internal clock by dividing the reference clock, and controls a division ratio with which the reference clock is divided, in response to the first control code.

5. The semiconductor device according to claim 1, wherein the second control code is from the exterior, and corresponds to a target operation speed of the semiconductor device.

6. The semiconductor device according to claim 1,
   wherein the feedback delay block comprises:
   a plurality of unit delay sections having a delay value corresponding to the voltage level of the internal voltage, and connected in series; and
   a selecting section suitable for transferring an output selected in response to the second control code among outputs of the plurality of unit delay sections, as the feedback clock, and
   wherein a first unit delay section connected first among the plurality of unit delay sections receives the output clock.

7. The semiconductor device according to claim 5,
   wherein, when the target operation speed of the semiconductor device is increased by changing the second control code, the delay value of the feedback delay block increases in response to the second control code, and the delay value of the output clock in the code generation block decreases, and the first control code is changed to correspond to a decrease in the delay value of the output clock, and the voltage level of the internal voltage rises and the frequency of the internal clock increases in response to the first control code, and wherein, when the target operation speed of the semiconductor device is decreased by changing the second control code, the delay value of the feedback delay block decreases in response to the second control code, and the delay value of the output clock in the code generation block increases, and the first control code is changed to correspond to an increase in the delay value of the output clock, and the voltage level of the internal voltage falls and the frequency of the internal clock decreases in response to the first control code.

8. The semiconductor device according to claim 1, wherein, if the voltage level of the internal voltage falls with the second control code fixed, the delay value of the feedback delay block increases, and the delay value of the output clock decreases, and wherein, if the voltage level of the internal voltage rises with the second control code fixed, the delay value of the feedback delay block decreases, and the delay value of the output clock increases.

9. The semiconductor device according to claim 1, further comprising:

an internal circuit suitable for operating using the internal voltage and the internal clock, at a speed corresponding to the voltage level of the internal voltage and the frequency of the internal clock.

10. A semiconductor system comprising:

a controller suitable for generating an external voltage, an external clock, and first to $N^{th}$ external control codes, wherein the N is a natural number greater than 1; and first to $N^{th}$ semiconductor devices each suitable for generating an output clock by delaying the external clock, controlling a delay value of the output clock based on a result of comparing phases of the external clock and a feedback clock, and generating an internal voltage with a voltage level corresponding to the delay value of the output dock and an internal clock with a frequency corresponding to the delay value of the output clock, wherein the feedback clock is generated by delaying the output clock by a delay value determined by a corresponding external control code among the first to $N^{th}$ external control codes.

11. The semiconductor system according to claim 10, wherein each of the first to $N^{th}$ semiconductor devices comprises:

a code generation block suitable for generating the output clock by delaying the external clock, controlling the delay value of the output clock based on the result of comparing the phases of the external clock and the feedback clock, and generating an internal control code corresponding to the delay value of the output clock;

a voltage generation block suitable for generating the internal voltage with the voltage level corresponding to the internal control code;

a clock generation block suitable for generating the internal clock with the frequency corresponding to the internal control code; and a feedback delay block suitable for generating the feedback clock by delaying the output clock by the delay value corresponding to the corresponding external control code.

12. The semiconductor system according to claim 11, wherein the code generation block operates using the external voltage, and the dock generation block and the feedback delay block operate using the internal voltage.

13. The semiconductor system according to claim 11, wherein the clock generation block generates the internal clock by dividing the external clock, and controls a division ratio with which the external clock is divided, in response to the internal control code.

14. The semiconductor system according to claim 11, wherein the first to $N^{th}$ external control codes correspond to respective target operation speeds of the first to $N^{th}$ semiconductor devices.

15. The semiconductor system according to claim 14, wherein, in each of the first to $N^{th}$ semiconductor devices, when the target operation speed of the semiconductor device is increased by changing the corresponding external control code, the delay value of the feedback delay block increases in response to the corresponding external control code and the delay value of the output clock in the code generation block decreases, and the internal control code is changed to correspond to a decrease in the delay value of the output clock, and the voltage level of the internal voltage rises and the frequency of the internal clock increases in response to the internal control code, and wherein, in each of the first to $N^{th}$ semiconductor devices, when the target operation speed of the semiconductor device is decreased by changing the corresponding external control code, the delay value of the feedback delay block decreases in response to the corresponding external control code, and the delay value of the output clock in the code generation block increases, and the internal control code is changed to correspond to an increase in the delay value of the output clock, and the voltage level of the internal voltage falls and the frequency of the internal clock decreases in response to the internal control code.

16. The semiconductor system according to claim 11, wherein, in each of the first to $N^{th}$ semiconductor devices, if the voltage level of the internal voltage falls with the corresponding external control code fixed, the delay value of the feedback delay block increases, and the delay value of the output clock decreases, and wherein, in each of the first to $N^{th}$ semiconductor devices, if the voltage level of the internal voltage rises with the corresponding external control code fixed, the delay value of the feedback delay block decreases, and the delay value of the output clock increases.

17. The semiconductor system according to claim 10, wherein the controller transmits an external control code for increasing a target operation speed to a semiconductor device with a high work load among the first to $N^{th}$ semiconductor devices, and transmits an external control code for decreasing a target operation speed to a semiconductor device with a low work load among the first to $N^{th}$ semiconductor devices.

18. The semiconductor system according to claim 10, wherein each of the first to $N^{th}$ semiconductor devices further comprises:

an internal circuit suitable for operating using the internal voltage and the internal clock, at a speed corresponding to the voltage level of the internal voltage and the frequency of the internal clock.

19. A method for operating a semiconductor device, comprising:

applying an external control code;

delaying an output clock, which is generated by delaying a reference clock, by a delay value corresponding to the external control code, and generating a feedback clock;

controlling a delay value of the output clock by comparing phases of the reference clock and the feedback clock, and generating an internal control code corresponding to the delay value of the output clock; and generating an internal voltage with a voltage level corresponding to the internal control code and an internal clock with a frequency corresponding to the internal control code.

20. The method according to claim 19, wherein, if a delay value of the feedback clock increases by changing the external control code, the voltage level of the internal voltage rises and the frequency of the internal clock increases, and wherein, if the delay value of the feedback clock decreases by changing the external control code, the voltage level of the internal voltage falls and the frequency of the internal clock decreases.

21. The method according to claim 19, wherein the generating of the feedback clock is performed using the internal voltage, and the generating of the internal control code is performed using an external voltage.

22. The method according to claim 19, wherein, if the voltage level of the internal voltage falls with the external control code fixed, the delay value of the feedback delay block increases, and wherein, if the voltage level of the internal voltage rises with the external control code fixed, the delay value of the feedback delay block decreases.

23. The method according to claim 19, wherein a value of the external control code is determined in response to a work load of the semiconductor device.

24. A semiconductor system comprising:

a controller suitable for generating an external clock and a plurality of external control codes; and a plurality of semiconductor devices each suitable for generating an internal control code, and controlling the internal control code by comparing the external clock and a feedback clock, generating an output clock by delaying the external clock by a first delay value determined by the internal control code, and generating the feedback clock by delaying the output clock by a second delay value determined by a corresponding one of the plurality of external control codes, wherein the plurality of semiconductor devices each generates an internal voltage with a voltage level corresponding to the internal control code and an internal clock with a frequency corresponding to the internal control code.

25. The method according to claim 24, wherein each of the plurality of semiconductor devices generates the feedback clock and the internal clock using the internal voltage.

* * * * *